US007003215B2

(12) United States Patent
Gelernt et al.

(10) Patent No.: US 7,003,215 B2
(45) Date of Patent: Feb. 21, 2006

(54) VAPOR FLOW CONTROLLER

(75) Inventors: Barry Gelernt, Oceanside, CA (US); James Clifford Matthews, Vista, CA (US)

(73) Assignee: Air Products and Chemicals, Inc., Allentown, PA (US)

(*) Notice: Subject to any disclaimer, the term of this patent is extended or adjusted under 35 U.S.C. 154(b) by 237 days.

(21) Appl. No.: 10/054,010

(22) Filed: Jan. 21, 2002

(65) Prior Publication Data

US 2003/0138242 A1 Jul. 24, 2003

(51) Int. Cl.
*B01D 3/06* (2006.01)

(52) U.S. Cl. .................. 392/399; 392/394; 392/400; 392/405; 118/726

(58) Field of Classification Search ............... 392/399, 392/394, 405, 402, 388, 400; 118/715, 726; 261/64.3, 141; 427/429.1
See application file for complete search history.

(56) References Cited

U.S. PATENT DOCUMENTS

| 4,191,512 A | * | 3/1980 | O'Neal et al. ............. 417/54 |
| 4,321,031 A | * | 3/1982 | Woodgate ................. 432/11 |
| 4,436,674 A | * | 3/1984 | McMenamin ............. 261/64.3 |
| 4,539,221 A | * | 9/1985 | Jacob et al. .............. 427/588 |
| 4,551,528 A | * | 11/1985 | Dockner et al. ........... 544/242 |
| 4,627,487 A | * | 12/1986 | Basiulis .................. 165/104.26 |
| 5,399,200 A | * | 3/1995 | Stauffer .................... 118/726 |
| 5,537,508 A | * | 7/1996 | Ebbing et al. ............. 392/402 |
| 5,556,479 A | * | 9/1996 | Bran ........................ 134/1.3 |
| 5,698,037 A | * | 12/1997 | Stauffer .................... 118/726 |
| 5,835,678 A | * | 11/1998 | Li ............................ 392/401 |
| 5,952,046 A | * | 9/1999 | Chayka ................... 427/249.1 |
| 5,966,499 A | * | 10/1999 | Hinkle et al. ............. 392/388 |
| 6,098,964 A | * | 8/2000 | Schmitt .................... 261/75 |
| 6,258,170 B1 | * | 7/2001 | Somekh et al. ........... 118/715 |
| 6,402,126 B1 | * | 6/2002 | Vaartstra et al. .......... 261/141 |
| 6,507,698 B1 | * | 1/2003 | Nagashima et al. ....... 392/389 |
| 2003/0093917 A1 | * | 5/2003 | DiBello ................... 34/443 |

OTHER PUBLICATIONS

"The Dynamics of bubblers as vapor delivery systems," Jour. Crystal Growth, 129, (1993) 119-133.
*Process Engineering Analysis In Semiconductor Device Fabrication*, Middleman, et al., McGraw-Hill, (1993).

\* cited by examiner

Primary Examiner—Robin O. Evans
Assistant Examiner—L Fastovsky
(74) Attorney, Agent, or Firm—R.P. Morris-Oskanian

(57) ABSTRACT

A vapor flow controller apparatus for delivery of chemical reagent vapors from a liquid phase source material is provided which includes a source container containing the liquid phase source material, a pump to transport the liquid phase source material to a vaporizor module, the pump having a flow rate controller, and the vaporizer module having a source material inlet, a carrier gas inlet, and a vaporized gas outlet. The vaporizer module converts the liquid phase source material to a vapor. The vapor flow controller apparatus further includes a source material conduit for passage of the liquid phase source material from the source container to the source material inlet of the vaporizer module. The vapor flow controller apparatus further includes a carrier gas container containing a carrier gas and having a carrier gas outlet conduit controlled by a mass flow controller.

19 Claims, 3 Drawing Sheets

VAPOR FLOW CONTROLLER

BACKGROUND OF THE INVENTION

The present invention is directed to providing controlled flow of a chemical reagent vapor. In particular, the present invention is directed to providing accurate, and reproducible flow of the chemical reagent vapor of a volatile liquid for use in the manufacture of semiconductor devices.

The accurate and reproducible control of reagent vapors to a reactor is critical to the manufacture of semiconductor devices, optoelectronic components, solid state lasers and numerous other high technology products. This is especially true for source materials (reagents) utilized in chemical vapor deposition (CVD) processes. In these processes, it is often necessary to introduce into the CVD reactor the vapor of volatile liquids, the vapor often being transported to the reactor in a carrier gas. For a number of less volatile source materials, maintaining the source container at elevated temperature to generate sufficient vapor pressure is not possible because of long term thermal decomposition of the source material. Safety is also a consideration in heating flammable liquids above their flash point in order to achieve sufficient vapor flow. These concerns are particularly true of many organometallic source materials.

An approach to the delivery of liquid source materials is the use of mass flow controllers employing Wheatstone Bridge type circuitry. These "thermal bridge" controllers are used extensively for delivering compressed gases, but lack the necessary sensitivity to measure and control a small vapor component diluted in a large flow of carrier gas. Additionally, the controller must be heated to avoid vapor condensation, but this decreases the temperature differential between the heated element in the sensor tube and the controller temperature, resulting in decreased flow sensitivity. A modification of this design for liquid use typically exhibits unacceptably long response time for step-function flow changes. This is due to the minute movement of liquid (unlike gases) through the sensor tube. Thermal decomposition of the source material in the heated sensor tube and consequent plugging and sensor drift also erode controller performance. The design, operation and performance limitations of the thermal bridge-type controllers are well known to those skilled in the art.

For the above reasons, it is desirable to avoid passing the source material through a flow sensor or controller. In this regard, and for more volatile-liquid source materials, it is common practice to utilize a bubbler-type source container and delivery system in which a carrier gas is bubbled through the liquid in the container; the carrier gas being saturated with the vapor of interest and resultant transport of the entrained vapor to the reactor. The relationship of the mass flow of vapor, the source container temperature, and the carrier gas flow rate are, to a first approximation, given by:

$$\text{Mass flow of vapor} = \frac{MW}{22{,}414} \cdot \frac{P_0(T)}{P - P_0 T} \cdot f$$

where P is the total pressure in the headspace over the liquid in the bubbler; $P_0$ is the vapor pressure of the neat liquid (or the total vapor pressure of several components in a liquid mixture), a function of the liquid temperature; f is the volume flow rate of carrier gas in standard cubic centimeters per minute (sccm), and MW is the gram-molecular weight of the vapor of interest. The theoretical and practical aspects of bubbler operation have been examined in, for example, A. Love, S. Middleman and A. Hochberg, "The Dyamics of Bubblers as Vapor Delivery Systems", *Jour. of Crystal Growth*, 129 pages 119–133 (1993) and S. Middleman and A. K. Hochberg, *Process Engineering Analysis in Semiconductor Device Fabrication*, McGraw-Hill (1993).

A number of difficulties exist with the bubbler method that significantly diminish its reliability. For example, at high carrier gas flow rates, rapid removal of the vapor over the liquid leads to evaporative cooling of the liquid surface with a concomitant drop in vapor pressure. This causes nonlinearity in the vapor flow/carrier gas flow relationship. In general, this and other difficulties result from the sensitivity of the delivery system behavior to temperature and temperature gradients. Moreover, in order to avoid condensation of the vapor downstream of the source container, heat tracing of all delivery lines, valves, filters, etc. must be undertaken. This adds additional cost, complexity and maintenance to the bubbler-type delivery system. Yet another drawback of the bubbler-type system relates to the fractional distillation that occurs as the liquid of a multi-component mixture is evaporated. This leads to concern about the concentration of impurities even in ostensibly single component liquid sources.

The present invention essentially eliminates the weaknesses characteristic of both the thermal bridge type controller and the bubbler-type delivery system.

BRIEF SUMMARY OF THE INVENTION

The present invention is a vapor flow controller apparatus for delivery of chemical reagent vapors from a liquid phase source material. In one preferred embodiment of the present invention, the vapor flow controller apparatus includes a source container containing the liquid phase source material, a pump to transport the liquid phase source material to a vaporizor module, the pump having a flow rate controller, the vaporizer module having a source material inlet, a carrier gas inlet, and a vaporized gas outlet. The vaporizer module converts the liquid phase source material to a vapor. The vapor flow controller apparatus further includes a source material conduit for passage of the liquid phase source material from the source container to the source material inlet of the vaporizer module. The vapor flow controller apparatus further includes a carrier gas container containing a carrier gas and having a carrier gas outlet conduit controlled by a mass flow controller. The flow rate controller provides flow of the liquid phase source material into the vaporizer module through the source material conduit at a desired mass flow rate, and the mass flow controller provides flow of the carrier gas at a corresponding controlled rate such that the liquid phase source material is vaporized and then is entrained in the carrier gas and carried out of the vaporizer module through the vaporized gas outlet.

Preferably, the source container is at ambient temperature. Additionally, a particulate filter on the source material conduit may be used. The mass flow controller preferably controls flow of the carrier gas, for example, in a range of approximately 10 standard cubic centimeters per minute to approximately 5 standard liters per minute. Of course, a smaller range within this larger range may be used dependent upon the requirements of the system.

Preferably, the vaporizer module comprises a vaporization chamber, for example, a quartz vaporization chamber, and a source of heat on an evaporative surface. The source of heat may be a radiant energy device that includes, for example, a quartz-iodine lamp and a focusing mirror. The source of heat preferably provides energy sufficient to heat and maintain the evaporative surface in the approximate temperature range of 80 degrees Celsius to 420 degrees Celsius. The source of heat may also be, for example, a resistive heating device or an inductive heating device. Preferably, the pressure regulator provides for flow of liquid phase source material in the approximate range 0.1 grams/minute to 35 grams/minute.

Additionally, in the preferred embodiment, the vaporizer module includes a thermal sensor to sense the temperature of the evaporative surface. The vapor flow controller apparatus may also include an electronic control module that regulates the duty cycle of the source of heat, based on a signal from the thermal sensor, to maintain the evaporative surface at a constant temperature. The vaporized gas outlet preferably provides flow of the vapor to a reactor for use in manufacture of semiconductor devices.

The pump may be inert gas in a pressurized inert gas container. The inert gas container here has an outlet and an inert gas conduit between the inert gas container outlet and the source container. The flow rate controller is an adjustable pressure regulator to regulate pressure of the inert gas in the inert gas container. Preferably, the pressure regulator provides for flow of liquid phase source material in the approximate range 0.1 grams/minute to 35 grams/minute.

Finally, the liquid source material has a latent heat of vaporization associated therewith which cools the evaporative surface and the cooling is counteracted by the source of heat. Power input to the source of heat to maintain the evaporative surface at a constant temperature is preferably directly proportional to mass flow of the liquid source material provided out the vaporized gas outlet.

DETAILED DESCRIPTION OF THE INVENTION

Figure 1:
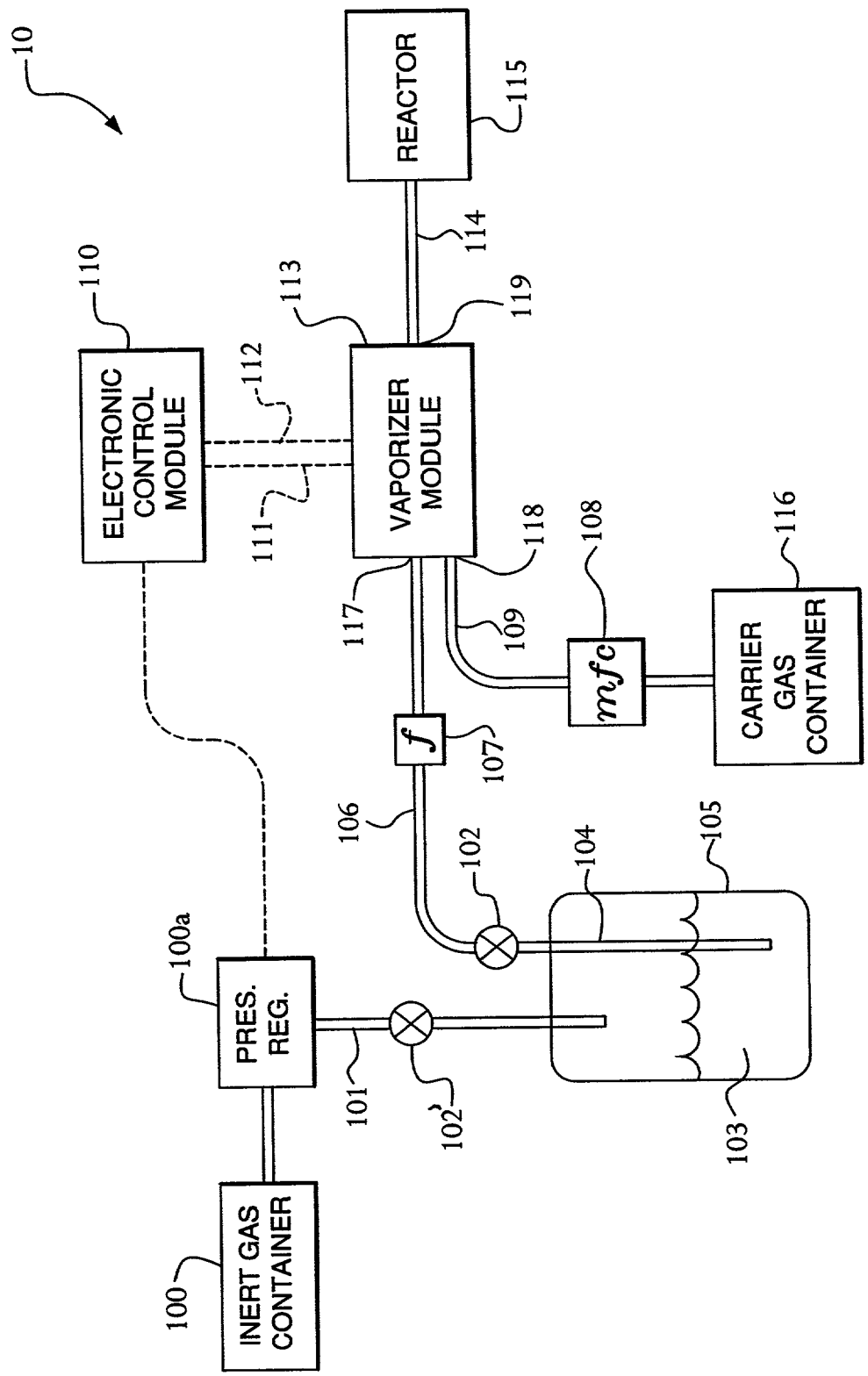
FIG. 1 is a schematic representation of the vapor flow controller apparatus in accordance with one preferred embodiment of the present invention.

Referring now to the drawings wherein like part numbers refer to like elements throughout the several views, there is shown in FIG. 1 a schematic representation of the vapor flow controller apparatus 10 in accordance with one preferred embodiment of the present invention. As can be seen in FIG. 1, liquid phase source material 103, contained in a preferably unheated, i.e., room temperature, source container 105, is pumped, preferably by means of, for example, inert gas pressure from a regulated supply, such as a pressurized inert gas container 100, through a down tube 104 of a source material conduit 106 through an optional shut-off valve 102 and an optional particulate filter 107, and continues via conduit 106, into a vaporizer module 113 through source material inlet 117. The down tube 104 is preferably capillary (or microbore) tubing. Alternatively, the pump may be, for example, a mechanical pump. The vaporized liquid is swept out of the vaporizer module 113 by a flow of carrier gas, from, for example, a carrier gas container 116, introduced into the vaporizer module 113 through carrier gas conduit 109 and carrier gas inlet 118. The vapor, converted from the liquid phase source material 103 by the vaporizer module 113, is entrained in the carrier gas and transported to a reactor 115, via vaporized gas outlet 119, and through carrier gas outlet conduit 114. The flow rate of liquid phase source material 103 is varied by varying the pressure of inert gas by an adjustable pressure regulator 100a on the pressurized inert gas container 100, through conduit 101, and shut-off valve 102', impressed upon the surface of the liquid contained in source container 105. The carrier gas flow is controlled by a mass flow controller (mfc) 108, however, the actual flow setting is not critical to the operation of the invention and may vary over a considerable range from approximately 10 sccm to 5 standard liters per minute (slm) depending on reactor processing conditions.

Figure 2:
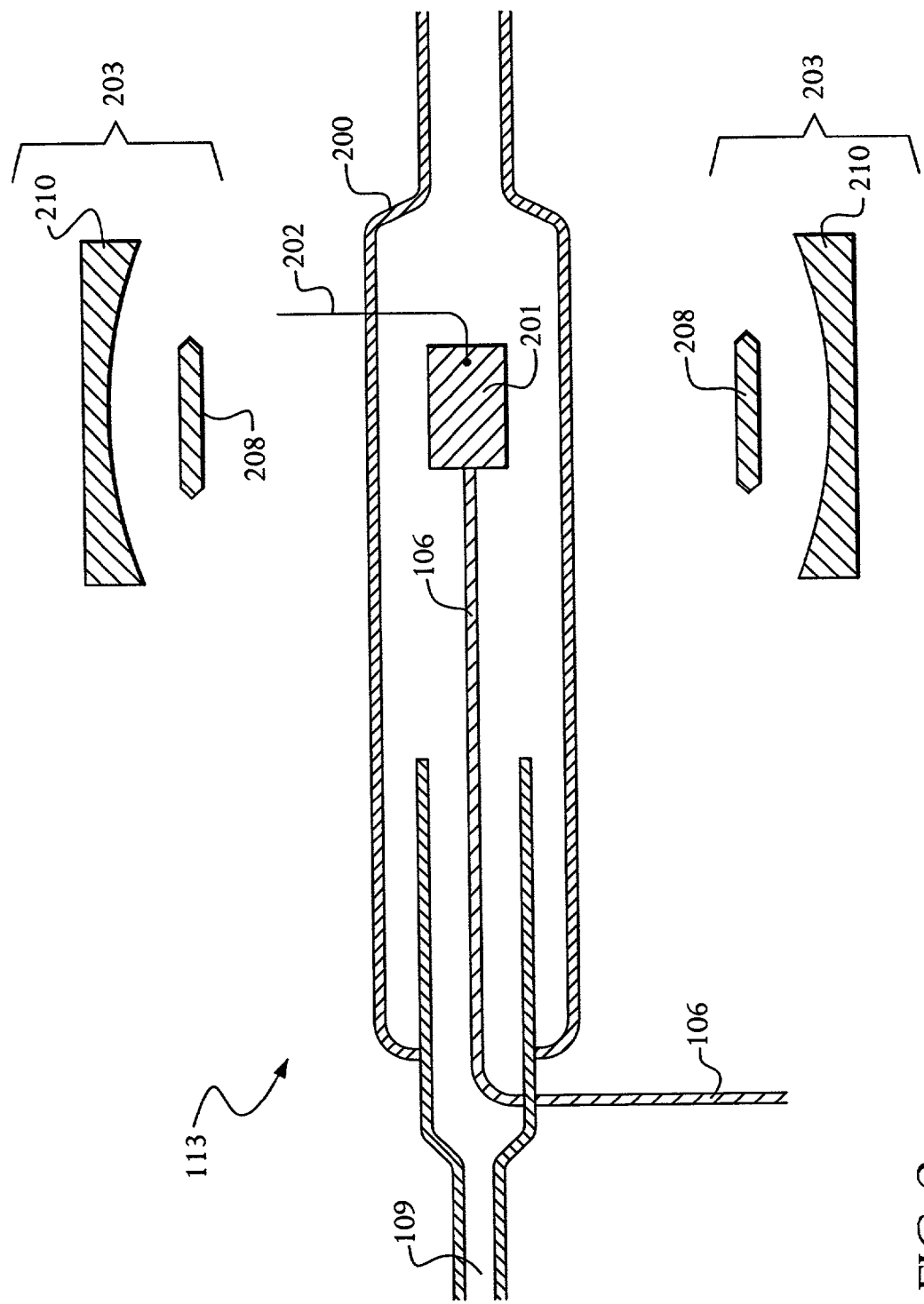
FIG. 2 is a schematic cross-sectional view of the components of the vaporizer module of the vapor flow controller of FIG. 1, in accordance with the preferred embodiment of the present invention.

As can be seen in FIG. 2, in the preferred embodiment of the invention, the vaporizer module 113, is comprised of a quartz vaporization chamber 200 and a source of heat 203, for example, a source of radiant energy (such as quartz-iodine lamps 208, and focusing mirrors 210), sufficient to heat and maintain the evaporative surface 201 of the vaporizer module 113 to a range within the approximate temperature range of 80 degrees Celsius to 420 degrees Celsius at sub-atmospheric pressures, and source material flow rates to a range within the approximate range of 0.1 grams/minute to 35 grams/minute. Alternative means of heating the evaporative surface 201, such as, for example, resistive heating or inductive heating, may be used lieu of radiative heating. The liquid phase source material 103 is flash evaporated on the evaporative surface 201 into a vapor and is swept by the carrier gas into the reactor 115.

The latent heat of vaporization of the liquid source material 103 cools the evaporative surface 201, but this is counteracted by energy input to the evaporative surface 201. The power input to maintain the evaporative surface 201 at constant temperature is directly proportional to, and is a direct measure of, the mass flow of the liquid source material 103.

Figure 3:
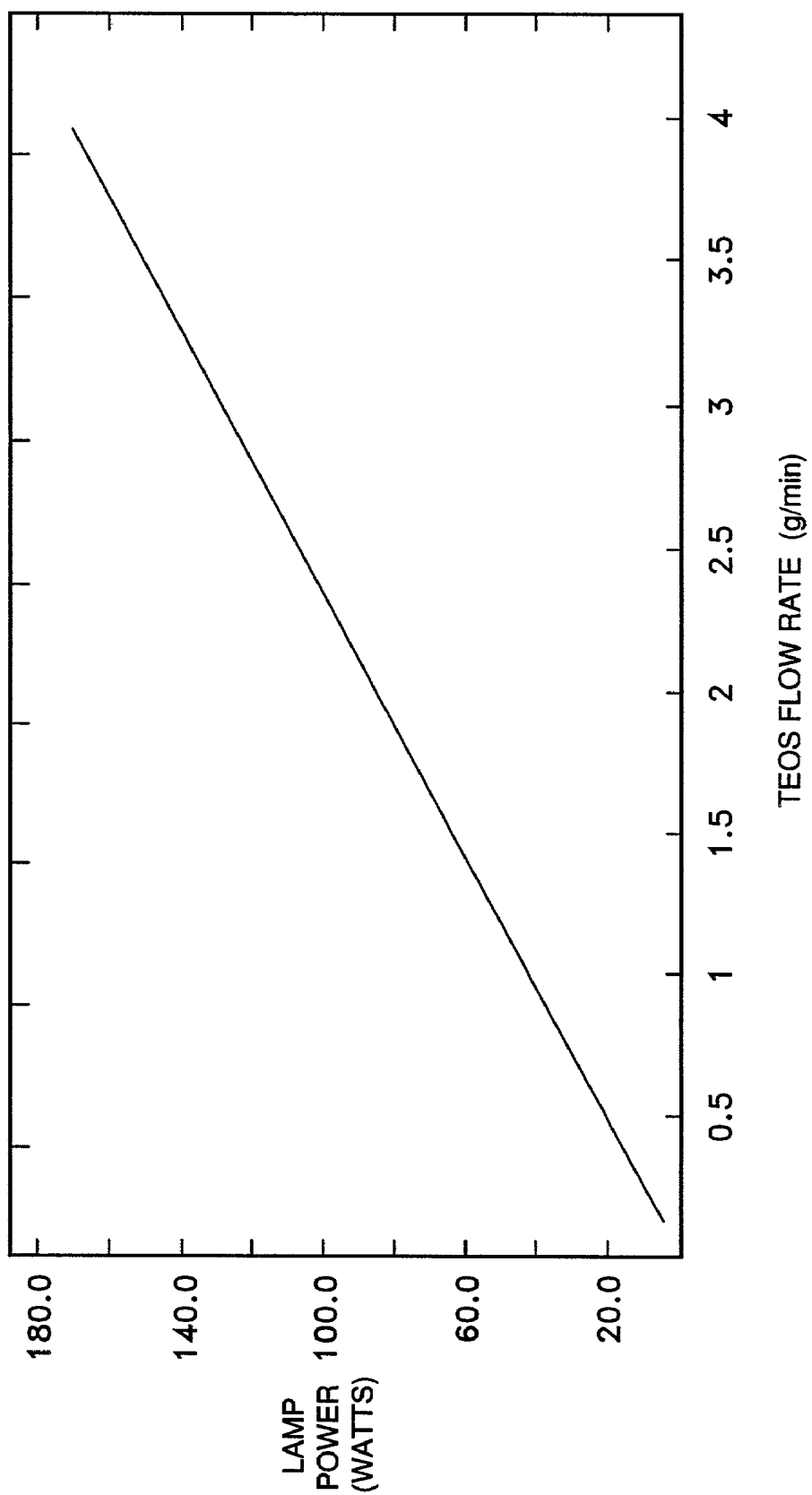
FIG. 3 is a graphical representation of the relationship of incident lamp power to TEOS flow rate.

Considerable scaling, primarily, but not exclusively, related to source material flow rate, is readily achievable and such scaling is within the spirit of the invention. Illustratively, if one utilizes tetraethylorthosilicate (TEOS) as the source material and nitrogen as the carrier gas entering the vaporization chamber 200, then, with constant radiant input to the evaporative surface 201, a 1.0 gram/minute change in TEOS flow rate results in approximately a 100 degrees Celsius change in temperature of the 5 g evaporative surface 201, as measured by an imbedded thermal sensor 202. Hence, the latent heat of vaporization of the TEOS on the evaporative surface, 201, is directly proportional to the temperature of the evaporative surface 201 under constant energy input conditions. In the preferred embodiment of operation of the apparatus 10, an electronic control module 110 (see FIG. 1), senses the temperature of the evaporative surface 201, via the embedded thermal sensor assembly 202, and regulates the duty cycle of lamps 208, in order to maintain the temperature of the evaporative surface 201, constant. It is noted that a measure of the integrated power to the lamps 208 is a direct measure of the source material flow rate. See FIG. 3. Accurate calibration of lamp power versus flow rate for a given source material is best accomplished by weighing the source container 105 both prior to and subsequent to source material depletion. Manual or automatically programmed changes in the source material flow rate are controlled by the electronic control module 110 to pressure regulator 100 interface.

Although illustrated and described herein with reference to specific embodiments, the present invention nevertheless is not intended to be limited to the details shown. Rather, various modifications may be made in the details within the scope and range of equivalents of the claims without departing from the spirit of the invention.

The invention claimed is:

1. A vapor flow controller apparatus for delivery of chemical reagent vapors from a liquid phase source material, said controller comprising:
   (a) a source container containing said liquid phase source material;
   (b) a pump to transport said liquid phase source material to a vaporizer module, said pump having a flow rate controller;
   (c) said vaporizer module having a source material inlet, a carrier gas inlet, and a vaporized gas outlet, said vaporizer module adapted to convert said liquid phase source material to a vapor;
   (d) a source material conduit for passage of said liquid phase source material from said source container to said source material inlet of said vaporizer module;
   (e) a carrier gas container containing a carrier gas, said carrier gas container having a carrier gas outlet conduit controlled by a mass flow controller;
   (f) said flow rate controller adapted to provide flow of said liquid phase source material into said vaporizer module through said source material conduit at a desired mass flow rate, said mass flow controller adapted to provide flow of said carrier gas at a corresponding controlled rate such that said liquid phase source material is vaporized and then is entrained in said carrier gas and carried out of said vaporizer module through said vaporized gas outlet; and
   (g) an electronic control module that is in electrical communication with the flow rate controller and the vaporizer module to deliver the chemical reagent vapors through the vaporized gas outlet at a certain flow rate based upon information received from the vaporizer module.

2. The vapor flow controller apparatus of claim 1, wherein said source container is at ambient temperature.

3. The vapor flow controller apparatus of claim 1, including a particulate filter on said source material conduit.

4. The vapor flow controller apparatus of claim 1, wherein said corresponding controlled rate provided by said mass flow controller is approximately 10 standard cubic centimeters per minute to approximately 5 standard liters per minute.

5. The vapor flow controller apparatus of claim 1, wherein said vaporizer module comprises a vaporization chamber and a source of heat on an evaporative surface.

6. The vapor flow controller apparatus of claim 5, wherein said vaporization chamber is a quartz vaporization chamber.

7. The vapor flow controller apparatus of claim 5, wherein said source of heat is radiant energy device.

8. The vapor flow controller apparatus of claim 7, wherein said radiant energy device includes at least one quartz-iodine lamp and a focusing mirror.

9. The vapor flow controller apparatus of claim 5, wherein said source of heat provides energy sufficient to heat and maintain said evaporative surface in a range within an approximate temperature range of 80 degrees Celsius to 420 degrees Celsius.

10. The vapor flow controller apparatus of claim 5, wherein said source of heat is a resistive heating device.

11. The vapor flow controller apparatus of claim 5, wherein said source of heat is an inductive heating device.

12. The vapor flow controller apparatus of claim 1, wherein said vaporizer module includes a thermal sensor to sense temperature of said evaporative surface.

13. The vapor flow controller apparatus of claim 12, wherein the electronic control module regulates a duty cycle of said source of heat, based on a signal from said thermal sensor, to maintain said evaporative surface at a constant temperature.

14. The vapor flow controller apparatus of claim 1, wherein said vaporized gas outlet provides flow of said vapor to a reactor for use in manufacture of semiconductor devices.

15. The vapor flow controller apparatus of claim 5, wherein said liquid source material has a latent heat of vaporization associated therewith which cools said evaporative surface, said cooling counteracted by said source of heat, wherein power input to said source of heat to maintain said evaporative surface at a constant temperature is directly proportional to mass flow of said liquid source material provided out said vaporized gas outlet.

16. The vapor flow controller apparatus of claim 1, wherein said pump comprises inert gas in a pressurized inert gas container, said inert gas container having an outlet and an inert gas conduit between said inert gas container outlet and said source container, and said flow rate controller is an adjustable pressure regulator to regulate pressure of said inert gas in said inert gas container.

17. The vapor flow controller apparatus of claim 16, wherein said pressure regulator provides for flow of liquid phase source material in a range within an approximate range of 0.1 grams/minute to 35 grams/minute.

18. A vapor flow controller apparatus for delivery of chemical reagent vapors from a liquid phase source material, said controller apparatus comprising:
   (a) a source container containing said liquid phase source material;
   (b) an inert gas in a pressurized inert gas container, said inert gas container having an outlet regulated by an adjustable pressure regulator;
   (c) an inert gas conduit between said inert gas container outlet and said source container;
   (d) a vaporizer module having a source material inlet, a carrier gas inlet, and a vaporized gas outlet, said vaporizer module adapted to convert said liquid phase source material to a vapor;
   (e) a source material conduit for passage of said liquid phase source material from said source container to said source material inlet of said vaporizer module;
   (f) a carrier gas container containing a carder gas, said carrier gas container having a carrier gas outlet conduit controlled by a mass flaw controller;
   (g) said pressure regulator adapted to provide flow of said inert gas through said inert gas conduit, into said source container such that said liquid phase source material is forced into said vaporizer module through said source material conduit at a desired mass flow rate, and said mass flow controller is adapted to provide flow of said carrier gas at a corresponding controlled rate such that said liquid phase source material is vaporized and then is entrained in said carder gas and carded out of said vaporizer module through said vaporized gas outlet; and
   (h) an electronic control module that is in electrical communication with the flow rate controller and the vaporizer module to deliver the chemical reagent vapors through the vaporized gas outlet at a certain flow rate based upon information received from the vaporizer module.

19. A vapor flow controller apparatus for delivery of chemical reagent vapors from a liquid phase source material comprising:
(a) a source container containing said liquid phase source material;
(b) a pump to transport said liquid phase source material to a vaporizer module, said pump having a flow rate controller;
(c) an electronic control module in electrical communication with flow rate controller and a vaporizer module;
(d) a vaporizer module comprising: an evaporative surface, a heat source, and a sensor in electrical communication with the evaporative surface and the electronic control module wherein the amount of liquid phase source material introduced into the vaporizer module and/or the heat source are controlled by the electronic control module based upon information obtained from the sensor.

* * * * *

UNITED STATES PATENT AND TRADEMARK OFFICE
CERTIFICATE OF CORRECTION

PATENT NO. : 7,003,215 B2
DATED : February 21, 2006
INVENTOR(S) : Barry Gelernt and James Clifford Matthews It is certified that error appears in the above-identified patent and that said Letters Patent is hereby corrected as shown below:

Column 6,
Lines 14 and 19, delete "liquid source material" and insert -- liquid phase source material --.
Line 49, delete "containing a carder gas" and insert -- containing a carrier gas --.
Line 51, delete "mass flaw controller" and insert -- mass flow controller --.
Line 60, delete "in said carder gas" and insert -- in said carrier gas --.
Line 60, delete "and carded out" and insert -- and carried out --.

Signed and Sealed this

Second Day of May, 2006

JON W. DUDAS
*Director of the United States Patent and Trademark Office*